United States Patent
Komatsu et al.

(10) Patent No.: US 7,262,613 B2
(45) Date of Patent: Aug. 28, 2007

(54) INSPECTION METHOD AND INSPECTION APPARATUS FOR INSPECTING ELECTRICAL CHARACTERISTICS OF INSPECTION OBJECT

(75) Inventors: Shigekazu Komatsu, Nirasaki (JP); Tadatomo Suga, Tokyo (JP); Toshihiro Itoh, Chiba (JP); Kenichi Kataoka, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/296,482

(22) Filed: Dec. 8, 2005

(65) Prior Publication Data

US 2006/0145716 A1  Jul. 6, 2006

Related U.S. Application Data

(63) Continuation of application No. PCT/JP04/08300, filed on Jun. 8, 2004.

(30) Foreign Application Priority Data

Jun. 9, 2003  (JP) .............................. 2003-164349

(51) Int. Cl.
  *G01R 31/02* (2006.01)
(52) U.S. Cl. ...................................... 324/754
(58) Field of Classification Search ................. 324/754
  See application file for complete search history.

(56) References Cited

U.S. PATENT DOCUMENTS

| | | | | |
|---|---|---|---|---|
| 5,436,571 | A * | 7/1995 | Karasawa | 324/765 |
| 5,557,215 | A * | 9/1996 | Saeki et al. | 324/765 |
| 6,529,011 | B1 * | 3/2003 | Okubo | 324/537 |
| 6,777,967 | B2 * | 8/2004 | Iino et al. | 324/757 |
| 2006/0061374 | A1 * | 3/2006 | Shinozaki et al. | 324/754 |

FOREIGN PATENT DOCUMENTS

| | | |
|---|---|---|
| EP | 1 182 460 A2 | 2/2002 |
| JP | 55-045247 | 3/1980 |
| JP | 63-258036 | 10/1988 |
| JP | 02-166746 | 6/1990 |
| JP | 11-064385 | 3/1999 |
| JP | 2002-139542 | 5/2002 |
| JP | 2002-176142 | 6/2002 |

OTHER PUBLICATIONS

International Preliminary Report on Patentability, no date.

Itoh et al., Characteristics of Fritting Contacts Utilized for Micromachined Wafer Probe Cards, Review of Scientific Instruments, *American Institute of Physics* vol. 71 No. 5, pp. 2224-2227 (2000).

Kataoka et al. "Low Contact-Force and Compliant Mems Probe Card Utilizing Fritting Contact," *Proceedings of the IEEE 15th Annual International Conference on Microelectro Mechanical Systems (MEMS)* (2002); IEEE International Micro Electro Mechanical Systems Conference, New York, NY: IEEE, vol. Conf. 15, pp. 364-367, (2002).

European Search Report for EP 04 74 5875 dated Jun. 19, 2006.

* cited by examiner

*Primary Examiner*—Ha Tran Nguyen
*Assistant Examiner*—Roberto Velez
(74) *Attorney, Agent, or Firm*—Finnegan, Henderson, Farabow, Garrett & Dunner, L.L.P.

(57) ABSTRACT

At least one pair of electrode formed on a mounting surface of a stage is in contact with a conductive layer formed on a first surface of an inspection object, and an electrical path is formed between the both by using a fritting phenomenon.

13 Claims, 3 Drawing Sheets

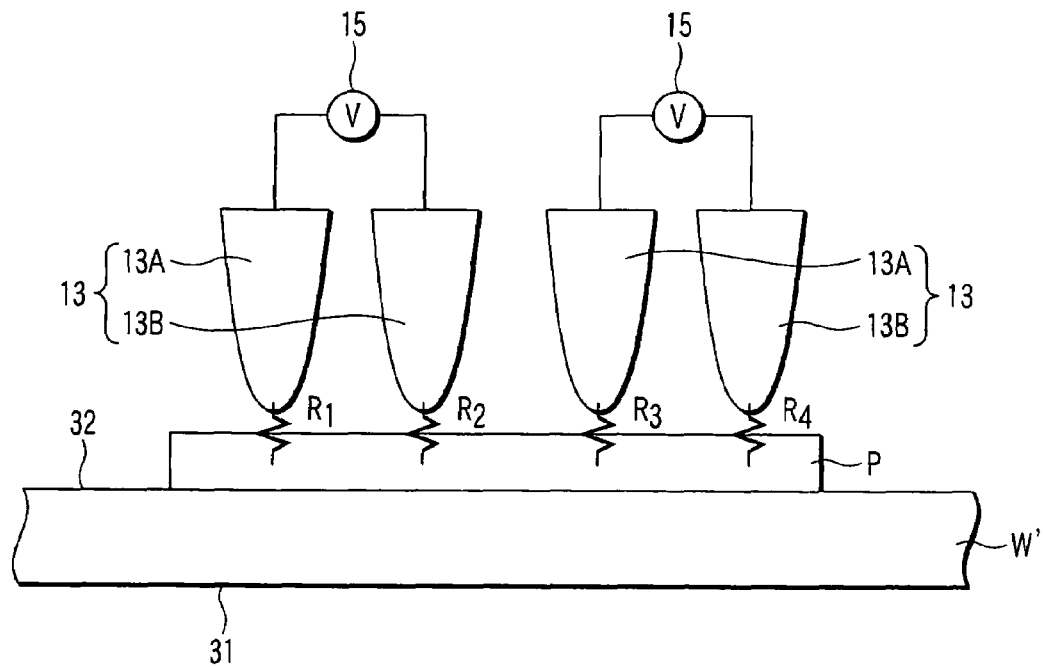
F I G. 2
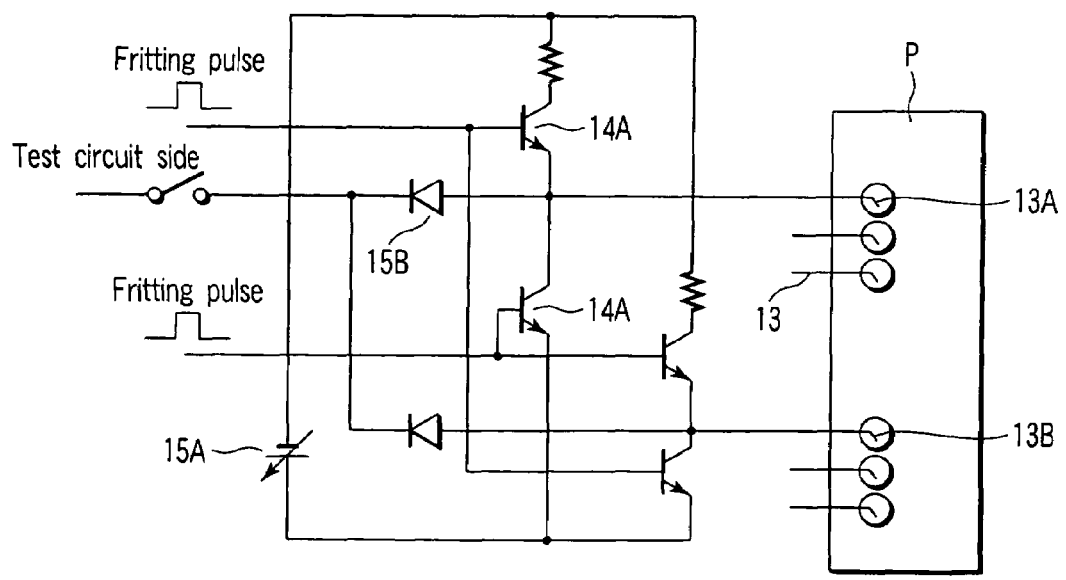
F I G. 3

INSPECTION METHOD AND INSPECTION APPARATUS FOR INSPECTING ELECTRICAL CHARACTERISTICS OF INSPECTION OBJECT

CROSS-REFERENCE TO RELATED APPLICATIONS

This is a Continuation Application of PCT Application No. PCT/JP2004/008300, filed Jun. 8, 2004, which was published under PCT Article 21(2) in Japanese.

This application is based upon and claims the benefit of priority from prior Japanese Patent Application No. 2003-164349, filed Jun. 9, 2003, the entire contents of which are incorporated herein by reference.

BACKGROUND OF THE INVENTION

1. Field of the Invention

The present invention relates to an inspection method and inspection apparatus for inspecting the electrical characteristics of an inspection object. More specifically, the invention relates to an inspection method and inspection apparatus capable of inspecting the electrical characteristics of an inspection object such as a device (for example, a power transistor) or each inspection object of plural devices formed on a single substrate.

2. Description of the Related Art

Upon inspecting the electrical characteristics of a device such as a power transistor, a large current and voltage are applied. For the purpose, it is necessary to bring probes into contact with electrodes of the device securely. In case of a device such as a power transistor, a stage, on which an inspection object is to be mounted, is electrically connected with an electrode (for example, a collector electrode) formed on the rear face of the inspection object. When, in this state, the electrical characteristics of the inspection object are inspected, the surface of the stage needs to be brought into secure contact with the collector electrode formed on the rear face of the inspection object.

Patent document 1 and patent document 2 disclose a technology for bringing the surface of a stage into electrical contact with a collector electrode formed on the rear face of an inspection object.

According to the technology described in patent document 1 (Jpn. Pat. Appln. KOKAI Publication No. 63-258036) (claim and page 2, upper right column, line 2 to lower left column, line 7), voltage applying electrodes for applying a voltage to a semiconductor wafer and voltage measuring electrodes for measuring a voltage of the semiconductor wafer are provided on the mounting surface of the stage. In this stage also, at least some of the voltage applying electrode and the voltage measuring electrodes are formed in the form of a belt. These electrodes are disposed alternately on the mounting surface of the stage. Such a configuration prevents a difference from occurring in a measuring result due to a difference in position of the semiconductor wafer in which a plurality of semiconductor chips have been formed.

Patent document 2 (Jpn. Pat. Appln. KOKAI Publication No. 2-166746, claim and page 2, upper right column, line 17 to page 3, upper left column, line 3) discloses the same kind of a stage as that disclosed in patent document 1. The mounting surface of the stage is divided into 2N (N is an integer of 2 or more), and voltage applying electrodes and voltage measuring electrodes are formed alternately on each division. The stage can exert the same operation and effect as those of the patent document 1.

Patent document 3 (Jpn. Pat. Appln. KOKAI Publication No. 11-64385 (claim and paragraphs [0006] to [0007]) discloses a technology concerning a probe. By this technology, connection pads of a device and probes are Kelvin-connected. Two probes are disposed in the vicinity of each other such that each of them can be electrically connected to a single connection pad. When the probes are pressed by the connection pad so that both of them make contact with each other, the probes are deformed elastically and make contact with the connection pads with tips of the two probes approaching with a fine interval.

The inventions described in the patent documents 1 and 2 can reduce the bad influence of the internal resistance of the collector electrode upon a measurement result when the collector electrodes formed on the rear face of a plurality of power devices and two kinds of electrodes formed on the mounting surface of the stage are electrically connected. However, no measure concerning connection of the probes and the electrodes of the device is taken. Therefore, by pressing the probes against the electrodes in the same manner as in the prior art, an oxide film on the electrode is scraped away and the probes are brought into electrical contact with the electrodes. Thus, there is a fear that the probes and electrodes may be damaged. If the size and the depth of a probe trace are limited in order to avoid a failure in a bonding process in the case of a power device, contact between the probes and the electrodes becomes unstable. Consequently, when a large current is applied, sparking occurs, thereby possibly damaging the probes. A loss that occurs in the electrical path between the probes and the electrode induces malfunction or the like, rendering accurate inspection impossible.

Although the probes described in patent document 3 can prevent the influence of foreign matter adhering to the probes, the probes are pressed against the connection pad conventionally, in order to bring the connection pads and the probes into contact with each other. As a result, the same problem as technology of patent document 1 exists.

BRIEF SUMMARY OF THE INVENTION

According to a first aspect of the present invention, there is provided an inspection method for inspecting the electrical characteristics of an inspection object W'. The inspection method comprises:

(a) mounting the inspection object on a mounting surface of a stage, the mounting surface of the stage comprising at least one third pair of electrodes, the third pair of electrodes having a first electrode and a second electrode, the inspection object having a first surface and a second surface, the first surface comprising at least one conductive layer Q, the inspection object being mounted on the mounting surface such that the conductive layer is in contact with the third pair of electrodes; and (b) applying a voltage to between at least one third pair of electrodes on the stage so as to generate a fritting phenomenon, and forming an electrical path between the third pair of electrodes and the conductive layer by using the fritting phenomenon.

The inspection method preferably comprises any one of the following items (1) to (4), or a combination of some of items (1) to (4):

(1) after the electrical path is formed between the third pair of electrodes and the conductive layer, connecting the third pair of electrodes to a test circuit 20;

(2) further comprising, before or after the step (b), or at the same time:

(c) with at least one pair of probes kept in contact with at least one fourth electrode P on the second surface of the inspection object, applying a voltage between the pair of probes so as to generate a fritting phenomenon, and forming an electrical path between each probe of the pair of probes and the fourth electrode by using the fritting phenomenon;

(3) after the electrical path is formed between each of the pair of probes and the fourth electrode, connecting at least one probe of the pair of probes to a test circuit; and (4) the device is a power device.

According to a second aspect of the present invention, there is provided an inspection apparatus for inspecting the electrical characteristics of an inspection object W'. The inspection apparatus comprises: a stage on which at least one inspection object W' is mounted (the stage comprises a mounting surface 11C which mounts the inspection object, and the mounting surface comprises at least one third pair of electrodes); a probe card 12 disposed above the stage and having a plurality of probes; a first fritting power supply which applies a fritting voltage between at least one pair of probes which makes contact with an electrode on a second surface of the inspection object and the electrode; and a second fritting power supply which applies a fritting voltage between a third pair of electrodes on a first surface of the inspection object and a conductive layer of the stage.

Preferably, the inspection apparatus further comprises:

(5) the inspection object having a first surface and a second surface, the first surface comprising at least one conductive layer Q, the second surface comprising at least one fourth electrode P, the inspection object being mounted on the mounting surface such that the conductive layer is in contact with the third pair of electrodes.

BRIEF DESCRIPTION OF THE SEVERAL VIEWS OF THE DRAWING

FIG. 2 is a schematic diagram for explaining a fritting phenomenon between the pair of probes of the inspection apparatus and an electrode of a device shown in FIGS. 1A and 1B.

FIG. 3 is a circuit diagram showing another fritting circuit for use in the inspection apparatus shown in FIGS. 1A and 1B.

DETAILED DESCRIPTION OF THE INVENTION

An embodiment of the invention can solve at least one of the above-described problems. The embodiment of the invention may be configured so as to form a stable electrical path between probes and devices without damaging or consuming the probes. The embodiment of the invention may be configured so that electrical connection is carried out securely and stable inspection is executed without any malfunction securely.

Figure 1A:
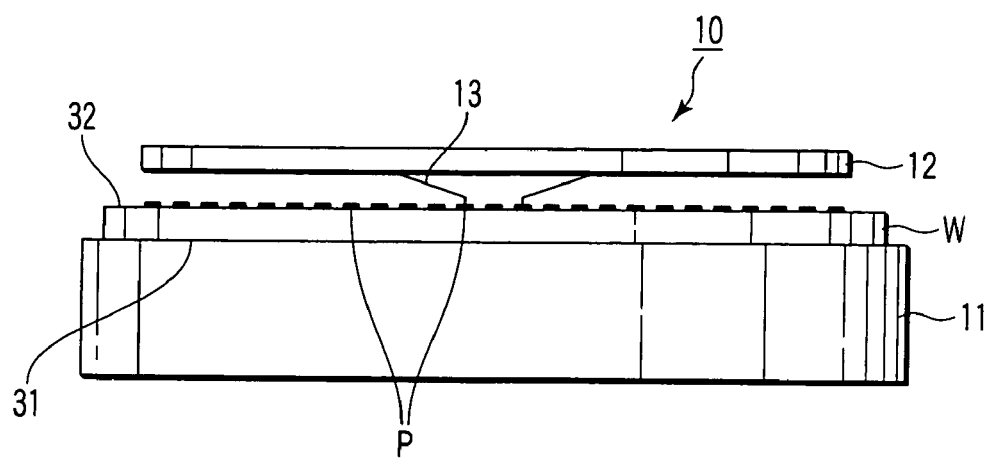
FIG. 1A is a side view showing major portions of en embodiment of an inspection apparatus of the invention.
Figure 1B:
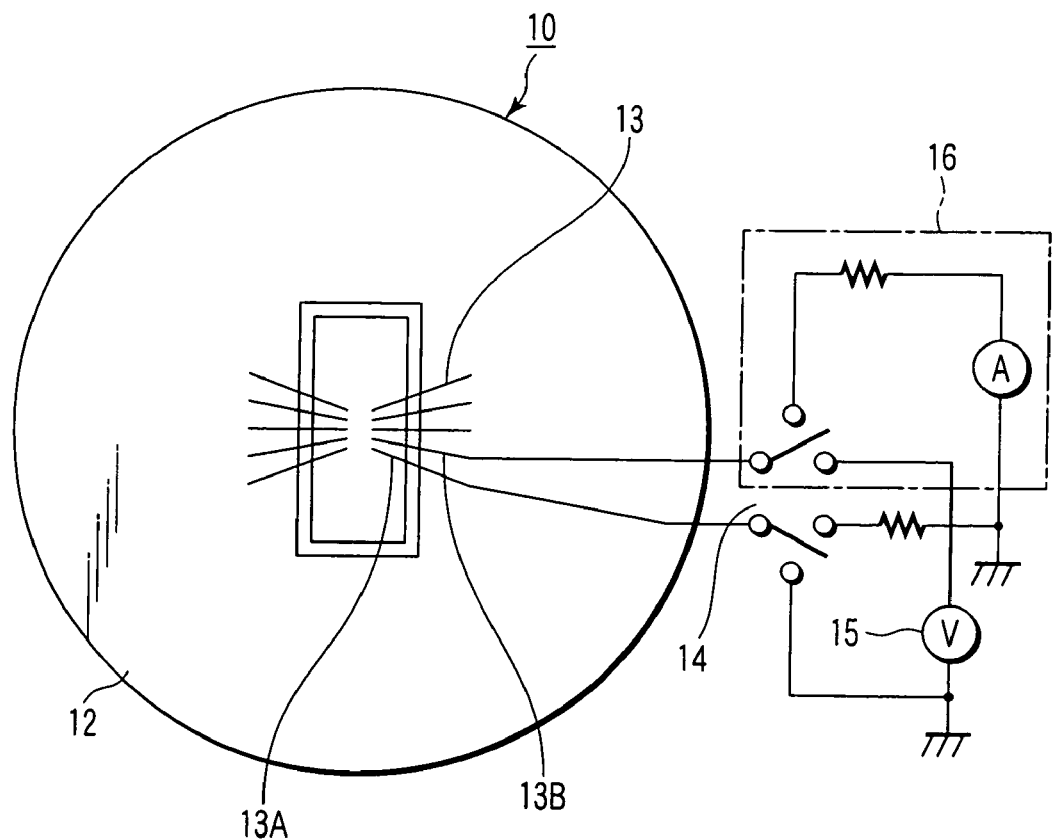
FIG. 1B is a schematic diagram showing a connection relation among a pair of probes, a fritting. power supply and a test circuit.

Hereinafter, the invention will be described on the basis of the embodiment shown in FIGS. 1 to 4. An inspection apparatus 10 of the embodiment comprises, as shown in FIG. 1A, a stage 11 (preferably, this stage can be moved horizontally and vertically) for mounting an inspection object (for example, a device or plural devices formed on a substrate W such as a wafer) and a probe card 12 disposed above the stage 11 and having a plurality of probes 13 (hereinafter, the substrate and inspection object are referred to as "wafer" and "device", respectively). As shown in FIGS. 1A and 1B, in a state in which the plurality of probes 13 on the probe card 12 are kept in contact with a fourth electrode P formed on a second surface 32 of the device W', a measurement signal is transmitted to the device from a test circuit 16 through the probe 13, so that the electrical characteristics of the device are inspected. The diameter of the tip of each of the probes 13 may be about 20 µm, and the probes 13 may be formed of conductive metal such as tungsten. The probe card 12 may be of such a type that the probes are brought into contact with a plurality of devices on a wafer collectively. If a probe card which makes such collective contact is used, a plurality of devices can be inspected with a single contact.

The probes 13 are preferred to have a configuration in which a first probe 13A for applying a fritting voltage and a second probe 13B for detecting a current of the fritting voltage make a pair as shown in FIG. 1B. Plural pairs of probes 13 each comprising the first and second probes 13A, 13B make contact with a single electrode (hereinafter a pair of first and second probes 13A, 13B is called "pair of probes 13"). As shown in FIG. 1B, each of the pair of probes 13 may be connected to a fritting power supply 15 or the test circuit 16 by switching a relay switch 14.

When the pair of probes 13 is connected to the first fritting power supply 15 through the relay switch 14, a voltage is applied from the first fritting power supply 15 to between the first probe 13A and the second probe 13B of the pair of probes 13 as schematically indicated in FIG. 2. This voltage generates a fritting phenomenon, so that an insulation film such as an oxide film on the fourth electrode (for example, made of aluminum) P is broken, and the first and second probes 13A, 13B make electrical contact with the fourth electrode so as to form an electrical path between the both. By using the fritting phenomenon, the pair of probes 13 can be brought into electrical contact with the electrode with a small pressure (for example, 0.1 to 1.0 g/probe) even if the oxide film exists on the electrode. As a consequence, a possibility that the electrode or the probe may be mechanically damaged is low, so that the electrical path can be formed securely.

The fritting phenomenon mentioned here refers to a phenomenon in which, when with a voltage applied to an insulation film such as an oxide film formed on the surface of metal (electrode in the invention), potential gradient turns to about $10^5$ to $10^6$ V/cm, a current flows, and the insulation film is destroyed.

To form a plurality of electrical paths in one electrode of the power device, it is permissible to build a semiconductor driver 14A or the like into a fritting circuit and apply a voltage to the plural pairs of probes 13 at the same time to generate the fritting phenomenon. In this case, the relay switch may be omitted.

A diode 15B is used in the fritting circuit shown in FIG. 3. The diode 15B may be disposed in an opposite orientation to FIG. 3, and may be omitted depending on a case.

In FIG. 2, plural pairs (two pairs in FIG. 2) of probes 13 make contact with one fourth electrode P. The value of contact resistance between each of the first and second probes 13A, 13B and the fourth electrode P can be of different values R1 to R4 because of diffusion or the like of the thickness of the oxide film on the fourth electrode P. Because the contact resistances R1 to R4 are connected in parallel, the entire contact resistance decreases as the number of the pairs of probes 13 increases.

Due to the fritting phenomenon, electrical paths are formed between each of the first and second probes 13A, 13B, and the fourth electrode P, so that the first and second probes 13A, 13B can be stably connected to the fourth electrode P. With this condition, as shown in FIG. 1B, the relay switch 14 is changed from the fritting power supply 15 to the test circuit 16 and connected. That is, the first probe 13A is connected to a monitor signal line of the test circuit 16, and the second probe 13B is connected to an inspection signal line of the test circuit 16. The test circuit 16 can inspect the electrical characteristics of a device securely and accurately.

Because electrical paths are formed between each of the first and second probes 13A, 13B of each pair of probes 13, and the fourth electrode P, plural pairs of probes 13 form a collective electrical path even if a voltage applied to the first and second probes 13A, 13B is low. An inspection of a power device to which a large current and voltage are applied, such as a dynamic test and switching test can be carried out by using the probe card 12. The number of the pairs of probes 13 can be set depending on the magnitude of current or voltage.

Figure 4A:
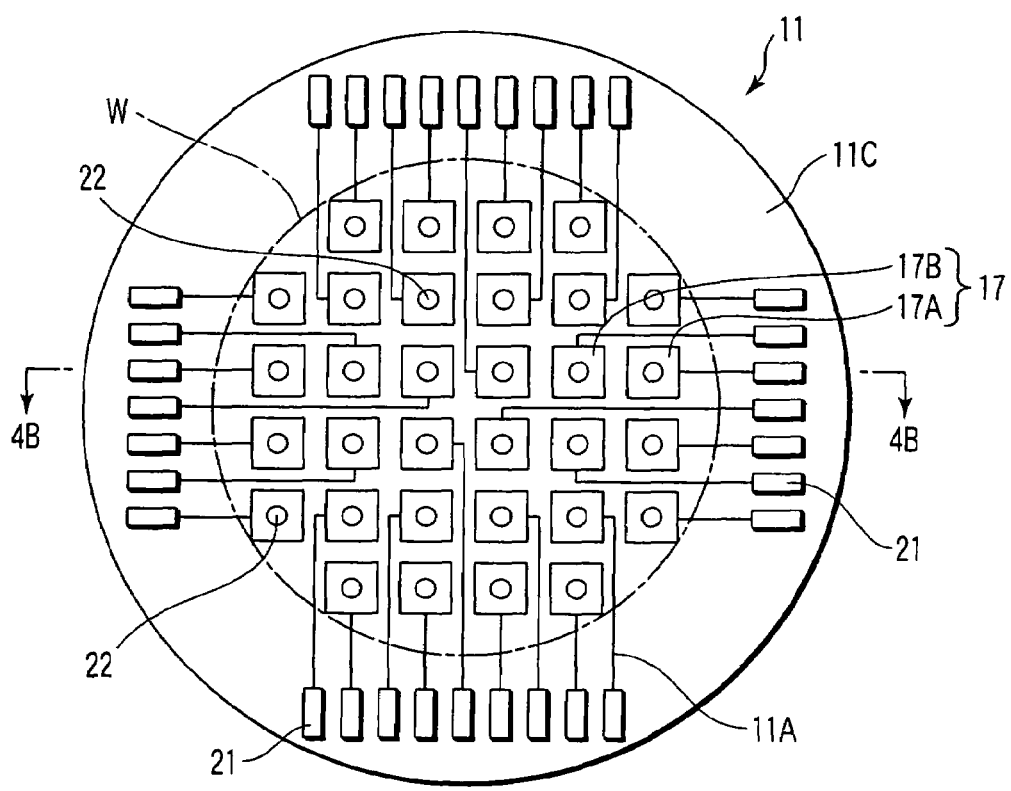
FIG. 4A is a plan view showing a relation between a stage of the inspection apparatus shown in FIG. 1 and a device.
Figure 4B:
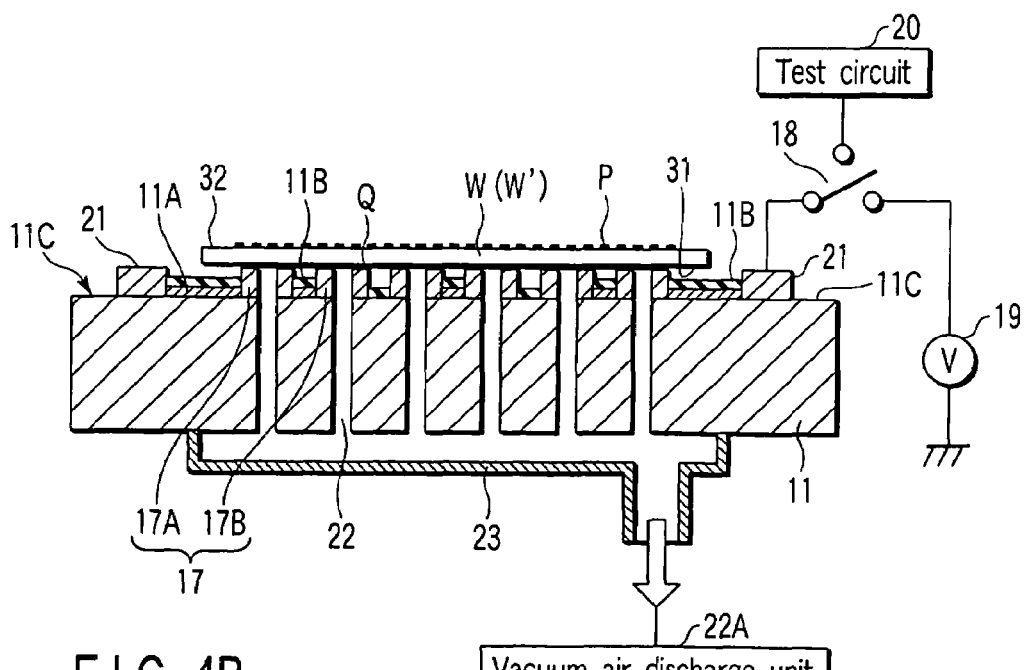
FIG. 4B is a sectional view showing the relation between the stage of the inspection apparatus and the device shown in FIGS. 1A and 1B.

FIGS. 4A and 4B show the stage 11 of the inspection apparatus 10 which can be used for an inspection of the power device. As shown in FIGS. 4A and 4B, a plurality of third pairs of electrodes 17 are formed on the mounting surface 11C of the stage 11. In FIGS. 4A and 4B, a plurality of third pairs of electrodes 17 (for example, 16 pairs) each are formed of a first electrode 17A and second electrode 17B. Each third pair of electrodes 17 includes the first electrode 17A and second electrode 17B like the pair of probes 13. The third pair of electrodes 17 is switched between a second fritting power supply 19 and a test circuit 20 through a relay switch 18 (FIG. 4B) and connected thereto. The second fritting power supply 19 may be used together with the first fritting power supply 15 (FIG. 1).

When the third pair of electrodes 17 is connected to the fritting power supply 19, a fritting phenomenon is generated by a voltage from the fritting power supply 19. The first and second electrodes 17A, 17B of the third pair of electrodes 17 make electrical contact with a conductive layer (collector electrode) Q formed on the first surface 31 of the wafer W or device W' (for example, a power device) so as to form an electrical path, thereby achieving electric connection. The first and second electrodes 17A, 17B of the third pair of electrodes 17 are disposed entirely in a matrix such that they adjoin each other as shown in FIGS. 4A. The third pairs of electrodes 17 may be disposed on the entire rear face of the wafer W. By generating a plurality of third pairs of electrodes 17 in the conductive layer Q, the third pairs of electrodes 17 may be electrically connected to a common electrode formed on the rear face of the wafer W or device W' by reducing a deviation depending on a place. As a result, an inspection with little error can be carried out.

If the third pair of electrodes 17 is switched from the second fritting power supply 19 to the test circuit 20 by the relay switch 18 in a state in which electrical connection is maintained, the third pair of electrodes 17 is connected to the test circuit 20 from the fritting power supply 19. For example, the first electrode 17A is connected to the monitor signal line and at the same time, the second electrode 17B is connected to the inspection signal line. With the third pair of electrodes 17 electrically connected to the conductive layer Q of the device securely and stably, the test circuit 20 can inspect the electrical characteristics of the device securely and accurately.

The stage 11 can be formed of ceramic such as aluminum nitride. A copper plating layer 11A is formed on the mounting surface 11C as shown in FIG. 4B. A plural pairs of electrodes 17 are formed on the copper plating layer 11A. Preferably, an insulation film (for example, a polyimide resin film) 11B is overlaid on the copper plating layer 11A between the first and second electrodes 17A, 17B. The insulation film 11B electrically insulates between the adjoining electrodes 17A and 17B. Preferably, for example, a step of about 1 µm is formed between the surface of the third pair of electrodes 17 and the surface of the polyimide resin film 11B. The wafer W or device W' makes contact with only the third pair of electrodes 17.

Pads 21, which are connected to the first and second electrodes 17A, 17B, are disposed on the outer peripheral portion of the mounting surface 11C. These pads 21 may be disposed so as to surround the plurality of third pairs of electrodes 17. The pads 21 are overlaid on the copper plating layer 11A in the same manner as in the first and second electrodes 17A, 17B, and preferably, the respective pads 21 are electrically insulated from one another by the polyimide resin film 11B. The electrodes 17A, 17B of the third pair of electrodes 17 are connected to the relay switch 18 through the pads 21.

As shown in FIG. 4B, discharge air passages 22 which are open in the surface of the first and second electrodes 17A, 17B are preferably formed in the stage 11. These discharge air passages 22 go through from the surfaces of the first and second electrodes 17A, 17B to the rear face of the stage 11. A vacuum jacket 23 is mounted on the rear face of the stage 11, and a vacuum air discharge unit 22A is connected to the vacuum jacket. 23. The vacuum air discharge unit 22A discharges air from within the vacuum jacket in the direction of an arrow so as to attract the wafer W or device W' onto the pairs of electrodes 17 with vacuum.

An example of an inspection method using the inspection apparatus of this embodiment will be described. In FIG. 4B, the device (for example, a power device) is mounted on the stage 11. In this case, the conductive layer Q provided on the first surface 31 of the device makes contact with the plurality of third pairs of electrodes 17 provided on the mounting surface 11C of the stage. By attracting onto the pairs of electrodes 17 with the vacuum air discharge unit, the wafer W is fixed on the stage 11.

The stage 11 moves to just below the probe card 12.

The stage 11 rises, and the fourth electrode P on the second surface 32 of the device W' comes into contact with the pairs of probes 13 of the probe card 12. By. overdriving the stage 11 about 50 µm, the pairs of probes 13 make contact with the fourth electrodes 4 of the device W (W') with stylus pressure of about 1 g/piece (FIGS. 1A and 2).

The relay switch 18 connects the third pairs of electrodes 17 with the second fritting power supply 19. A voltage is applied from the second fritting power supply 19 to the third pairs of electrodes 17. The fritting phenomenon occurs, so that electrical paths are formed between each of the electrodes 17A, 17B of each of the plurality of third pairs of electrodes 17, and the conductive layer Q on the first surface of the device.

The relay switch 14 connects the first fritting power supply 15 to the pairs of probes 13 on the side of the probe card 12. A voltage is applied form the first fritting power supply 15 to the pairs of probes 13. The fritting phenomenon occurs, so that electrical paths are formed between each of the probes 13A, 13B of each of the plural pairs of probes 13 and the fourth electrodes P of the device. The third pairs of electrodes 17 on the stage 11 and the conductive layer Q on the first surface 31 of the device W' are electrically connected stably through the electrical paths.

The relay switch 18 changes the plurality of third pairs of electrodes 17 from the second fritting power supply 19 to the test circuit 20 on the stage 11 side. The relay switch 14 changes the plurality of pairs of probes 13 from the first fritting power supply 15 to the test circuit 16 on the probe card 12 side. With a voltage or a large current applied to the plurality of probes 13, the electrical characteristics of the device can be inspected by using the test circuits 16, 20.

According to this embodiment, as described above, it is preferable that the wafer W or device W' is mounted on the stage 11 and that the pairs of probes 13 are brought into contact with the fourth electrodes P. The fritting phenomenon is generated by applying a fritting voltage to each of the pairs of probes 13. Using the fritting phenomenon, electrical paths are formed between each of the probes 13A, 13B of the pairs of probes 13 and the fourth electrode P. As a result, the pair of probes 13 and the fourth electrode P may be electrically connected to each other securely with an extremely low stylus pressure. A stable electrical path may be formed between the fourth electrode P of the device and each of the probes 13A, 13B without damaging or consuming the first and second probes 13A, 13B of the pair of probes 13 so as to form a secure electric connection. Even if a large current is applied to the device from the pair of probes 13, the electrical characteristics can be inspected securely and stably without any malfunction.

Preferably, on the stage 11 side, in a state in which the plurality of third pairs of electrodes 17 formed on the mounting surface 11C and the conductive layer (collector electrode) formed on the first surface 31 of the wafer W or the device are kept in contact with each other, the fritting voltage is applied to the plurality of third pairs of electrodes 17 so as to generate the fritting phenomenon. The electrical path is formed between each of the respective electrodes 17A, 17B of the third pair of electrodes 17 and the conductive layer Q by using this fritting phenomenon. Therefore, stable electric connection can be formed between the third pair of electrodes 17 on the stage 11 and the conductive layer Q on the first surface 31 of the device W'.

According to this embodiment, it is preferable that, after electrical paths are formed between each of the plurality of pairs of probes 13 and the fourth electrode P of the device, the pair of probes 13 is connected to the test circuit so as to form the electrical path between each of the plurality of third pairs of electrodes 17 and the conductive layer (collector electrode) on the second surface of the device, and then each of the pairs of electrodes 17 is connected to the test circuit 20. The test circuits 16, 20 can inspect the electrical characteristics of the device securely.

According to this embodiment, the air discharge passages, which are open to the top face of each of the electrodes 17A, 17B on the mounting surface 11C of the stage 11, are provided in the stage 11. The wafer W can be fixed securely on each of the electrodes 17A, 17B, so that the respective electrodes 17A, 17B and the conductive layer Q on the first surface 31 of the device can be connected electrically, simply and easily.

Preferably, the pads 21 electrically connected to the respective electrodes 17A, 17B of the third pair of electrodes 17 are provided on the outer peripheral portion of the mounting surface 11C of the stage 11. The respective pairs of electrodes 17 may be connected to the relay switch easily through the pads 21.

The present invention is not restricted to the above-described respective embodiments, and any inspection method and inspection apparatus for electrically connecting the probes and the electrodes of device or the third pair of electrodes formed on the mounting surface 11C of the stage and the conductive layer Q of the first surface of the device by using the fritting phenomenon are included in the present invention.

According to the invention, a case of inspection of the power device has been described, and the present invention can be applied widely to other devices.

According to the present invention, electric connection can be performed securely by forming a stable electrical path between the probe and the device without damaging or consuming the probe. As a consequence, the invention can provide an inspection method and inspection apparatus capable of carrying out a stable inspection without any malfunction.

What is claimed is:

1. An inspection method for inspecting the electrical characteristics of an inspection object, the inspection method comprising:
    (a) mounting the inspection object on a mounting surface of a stage, the mounting surface of the stage comprising at least one pair of electrodes, the at least one pair of electrodes having a first electrode and a second electrode, the inspection object having a first surface and a second surface, the first surface comprising at least one conductive layer, the inspection object being mounted on the mounting surface such that the at least one conductive layer is in contact with the at least one pair of electrodes; and
    (b) applying a voltage to the at least one pair of electrodes on the stage so as to generate a fritting phenomenon, and forming an electrical path between the at least one pair of electrodes and the at least one conductive layer by using the fritting phenomenon.

2. The inspection method according to claim 1, further comprising:
    after the electrical path is formed between the at least one pair of electrodes and the conductive layer, connecting the at least one pair of electrodes to a test circuit.

3. An inspection method according to claim 1, further comprising, before or after the step (b), or at the same time:
    (c) with at least one pair of probes kept in contact with at least one additional electrode on the second surface of the inspection object, applying a voltage to the pair of probes so as to generate a fritting phenomenon, and forming an electrical path between each probe of the pair of probes and the at least one additional electrode by using the fritting phenomenon.

4. The inspection method according to claim 3, further comprising:
    after the electrical path is formed between the at least one pair of probes and the at least one additional electrode, connecting at least one probe of the at least one pair of probes to a test circuit.

5. The inspection method according to claim 1, wherein the inspection object is a power-system device.

6. The inspection method according to claim 1, wherein the at least one pair of electrodes comprises more than one pair of electrodes.

7. An inspection apparatus for inspecting electrical characteristics of an inspection object, comprising:
- a stage on which at least one inspection object is mounted, the stage comprising a mounting surface which mounts the at least one inspection object, the mounting surface comprising at least one pair of electrodes;
- a probe card disposed above the stage and having a plurality of probes;
- a first fritting power supply which applies a fritting voltage to at least one pair of probes which makes contact with an electrode on a second surface of the at least one inspection object and the electrode; and
- a second fritting power supply which applies a fritting voltage to the at least one pair of electrodes on a first surface of the at least one inspection object and a conductive layer of the stage.

8. The inspection apparatus according to claim 7, wherein the at least one pair of electrodes comprises more than one pair of electrodes.

9. An inspection apparatus for inspecting the electrical characteristics of an inspection object, comprising:
- (a) a stage on which at least one inspection object is mounted, the stage comprising a mounting surface which mounts the inspection object, the mounting surface of the stage comprising at least one pair of electrodes, the at least one pair of electrodes having a first electrode and a second electrode, the inspection object having a first surface and a second surface, the first surface comprising at least one conductive layer, the inspection object being mounted on the mounting surface such that the conductive layer is in contact with the at least one pair of electrodes; and
- (b) a fritting power supply which applies a fritting voltage to the at least one pair of electrodes on the stage so as to generate a fritting phenomenon, and forms an electrical path between the at least one pair of electrodes and the conductive layer by using the fritting phenomenon.

10. The inspection apparatus according to claim 9, wherein a connector connects the at least one pair of electrodes to a test circuit after the fritting power supply forms an electrical path between the at least one pair of electrodes and the conductive layer.

11. The inspection apparatus according to claim 9, wherein, before or after the step (b), or at the same time,
- (c) a fritting power supply applies a voltage at least one pair of probes, with the at least one pair of probes kept in contact with at least one additional electrode on the second surface of the inspection object, so as to generate a fritting phenomenon, and forms an electrical path between each probe of the pair of probes and the at least one additional electrode by using the fritting phenomenon.

12. The inspection apparatus according to claim 11, wherein, a connector connects the at least one pair of electrodes to a test circuit after the fritting power supply forms an electrical path between the at least one pair of probes and the at least one additional electrode.

13. The inspection apparatus according to claim 9, wherein, the inspection object is a power-system device.

* * * * *